United States Patent
Lajevardi et al.

(10) Patent No.: US 10,721,424 B2
(45) Date of Patent: Jul. 21, 2020

(54) ANALOG-TO-DIGITAL CONVERTER (ADC) SAMPLING SYSTEM

(71) Applicant: Robert Bosch GmbH, Stuttgart (DE)

(72) Inventors: Pedram Lajevardi, Menlo Park, CA (US); Rainer Blechschmidt, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 13 days.

(21) Appl. No.: 16/251,551

(22) Filed: Jan. 18, 2019

(65) Prior Publication Data

US 2019/0268560 A1   Aug. 29, 2019

Related U.S. Application Data

(60) Provisional application No. 62/634,240, filed on Feb. 23, 2018.

(51) Int. Cl.
| | |
|---|---|
| *H04N 5/3745* | (2011.01) |
| *H03M 1/12* | (2006.01) |
| *H03M 1/46* | (2006.01) |
| *G06T 5/00* | (2006.01) |
| *G06T 5/50* | (2006.01) |

(Continued)

(52) U.S. Cl.
CPC ......... *H04N 5/37452* (2013.01); *G06T 5/001* (2013.01); *G06T 5/50* (2013.01); *H03M 1/1245* (2013.01); *H03M 1/46* (2013.01); *H03M 1/462* (2013.01); *H04N 5/23254* (2013.01); *H04N 5/378* (2013.01); *G06T 2207/20224* (2013.01)

(58) Field of Classification Search
CPC ........... H04N 5/37452; H04N 5/23254; H04N 5/378; H04N 5/3456; H04N 5/232; H03M 1/46; H03M 1/462; H03M 1/1245; G06T 5/50; G06T 5/001; G06T 2207/20224; G06T 7/254; G06T 7/00; G06T 2207/10016

See application file for complete search history.

(56) References Cited

U.S. PATENT DOCUMENTS 5,311,306 A * 5/1994 Tanaka ................. H04N 9/78
  348/488
5,339,104 A * 8/1994 Hong ............... G08B 13/19602
  348/155

(Continued)

FOREIGN PATENT DOCUMENTS

| JP | 2841675 B2 * | 12/1998 | ............. H04N 5/325 |
| WO | 2005006397 A2 | 1/2005 | |
| WO | 2008060124 A2 | 5/2008 | |

OTHER PUBLICATIONS

"PCT International Search Report" corresponding to International Application No. PCT/EP2019/054198 (5 pages).

(Continued)

*Primary Examiner* — Nhan T Tran
(74) *Attorney, Agent, or Firm* — Maginot, Moore & Beck LLP

(57) ABSTRACT

An analog-to-digital converter (ADC) sampling system and method for imaging and non-imaging systems to conserve power consumption is provided. The ADC sampling system performs only two comparisons for each pixel based on a background value and a threshold value to determine whether the light detected by the pixel is different from a background image.

8 Claims, 5 Drawing Sheets

(51) Int. Cl.
*H04N 5/378* (2011.01)
*H04N 5/232* (2006.01)

(56) References Cited

U.S. PATENT DOCUMENTS

2009/0066782 A1* 3/2009 Choi ................. H04N 3/155
                                          348/25
2010/0277607 A1* 11/2010 Choi ................. H04N 5/35554
                                          348/222.1
2017/0054922 A1* 2/2017 Novotny ........... H01L 21/76224

OTHER PUBLICATIONS

Yang, Sang-Hyeok et al., "An Ultra Low Power CMOS Motion Detector," IEEE Transactions on Consumer Electronics, vol. 55, No. 4, 2009 (6 pages).

* cited by examiner

ANALOG-TO-DIGITAL CONVERTER (ADC) SAMPLING SYSTEM

CROSS-REFERENCE TO RELATED APPLICATION

This application is a utility filing from and claims priority to pending U.S. Provisional application No. 62/634,240, filed on Feb. 23, 2018, the entire disclosure of which is incorporated herein by reference.

FIELD

This disclosure relates generally to an analog-to-digital converter (ADC) sampling system and method for a device to respond to external stimuli

BACKGROUND

Computer Vision (CV) algorithms are used in a variety of applications such as surveillance, smart home, autonomous driving, just to name a few. Many CV algorithms rely on background subtraction to identify moving objects. In such algorithms, a background model is first generated, which is then used to identify objects. Since the background model changes, due to the changes in lighting, movement of background objects such as chairs and so forth, the background model has to be constantly updated.

Other sensors employ similar algorithms to subtract background sensed information, although the range of background model changes for non-optical sensors is generally more limited than in CV applications. However, whether the sensors or detectors are configured to detect light, sound or heat, many such detectors rely on comparing the light, sound or heat of a new object to the ambient or background conditions, or to some other reference value. Many such sensors or detectors rely on converting an analog signal from the sensor to a digital signal, and it is this digital signal that is compared between newly detected conditions and background information. The number and density of the sensors can mean that the amount of data being transmitted and compared can be very large. Performing background comparisons for such large amounts of data can be unwieldy and slow, and even prohibitive in a worst case. Thus, there is a need for a system in an attempt to reduce data rate and also power consumption.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure relate to an analog-to-digital converter (ADC) sampling system and method for a device to respond to external stimuli. In one embodiment, the device is an optical sensing/detecting device that comprises a digital or computer processor proximal to a pixel array that is configured to control the pixel array. The processor is operable to execute a set of instructions defining a processing algorithm that are either stored on the processor or stored on a computer implemented module. The set of instructions direct the processor to detect an object, either moving or static, select one or more pixels which are needed on the next frame, and then control the pixel array. In another embodiment, the processor is configured to detect the object based on sound, motion, or temperature induced by the object. In a further embodiment, the "pixel array" for the sensing device includes an array of sensors configured to sense a measurable parameter, such as sound, motion or temperature. Further embodiments are contemplated in which the "array" is a single sensor configured to detect whether a measurable parameter is within a threshold of a reference value. For instance, a single temperature sensor may be operable to determine whether the ambient temperature is within a predetermined temperature range of a reference temperature. The reference temperature can be a predetermined temperature or can be a temperature detected at an earlier time—i.e., a background temperature.

In embodiments incorporating optical sensors/detectors, the processor includes a subtraction module that is operable to subtract background pixels from an image, leaving a foreground image for further processing. According to a further aspect of the disclosure, the subtraction module incorporates a logic-based Analog-to-Digital Converter (ADC) that performs a pixel-by-pixel comparison to determine foreground pixels. In one aspect, the logic ADC only generates one of three binary values indicative of whether the image pixel is below a threshold around a background pixel intensity, above the threshold or within the threshold. In a further adaptation, the logic ADC can be operable to generate a fourth binary value indicating that a particular pixel has not been evaluated. The logic ADC can work with other sensors that provide an analog signal and that require comparison to an ambient or background signal.

In one aspect, the logic ADC of the present disclosure follows the architecture of a SAR (successive approximation register) ADC. However, whereas the conventional SAR ADC has no foreknowledge of what information is sought, the logic ADC of the present disclosure knows that it is "looking" for a new signal to fall inside or outside a known threshold band. The logic ADC of the present disclosure includes a sample-and-hold or track-and-hold component to receive the incoming analog signal from the sensor. This input voltage is fed to one input of a comparator. The other input to the comparator is a reference voltage corresponding to an upper limit value of a band centered on a background or ambient signal corresponding to the same sensor or pixel. Based on the outcome of the comparator, a logic module within the logic ADC seta a most-significant-bit (MSB) to a corresponding binary value—either a binary "0" if the input voltage exceeds the reference voltage or a binary "1" if the input voltage is less than the reference voltage.

The logic module then advances the reference voltage to a second voltage corresponding to the lower limit value of the band centered on the background signal. This new reference signal is compared to the input voltage and based on the outcome of the comparator, the logic module seta a least-significant-bit (LSB) to a corresponding binary value—either a binary "0" if the input voltage is less than the reference voltage or a binary "1" if the input voltage is exceeds the reference voltage. The two bits—MSB and LSB—thus provide a digital output indicative of whether the new input signal falls within a predetermined threshold around a background signal, indicative of whether or not the new signal is merely part of the background or part of a new object.

It is understood that this same logic module architecture can be utilized for other sensors/detectors as discussed above. For instance, where a prior temperature sensor may require ten bits of information to determine whether a sensed temperature is within a temperature range, the SAR-based architecture of the logic module of the present disclosure allows two bits of data as indicative of whether the temperature is within the predetermined range. Thus, in one embodiment, A sensor operable to sense a measurable parameter comprises at least one sensor element configured and operable to sense the measurable parameter and to generate a new voltage signal in response to the intensity of measurable parameter detected by the sensor element. A memory is provided for storing digital values corresponding to a pre-determined voltage bandwidth around a reference voltage signal R, in which the reference voltage signal R corresponds to a reference value for the measurable parameter at a selected one of the at least one sensor element. The voltage bandwidth defines a positive delta voltage +Δ and a negative delta voltage −Δ relative to the reference voltage signal R corresponding to a threshold around the reference value for the measurable parameter.

The sensor further includes a sample-and-hold or track-and-hold module operable to sample the new voltage signal corresponding to the selected one of the at least one sensor element, a digital-to-analog converter generating a reference voltage R+Δ or R−Δ from the digital values stored in the memory, and a comparator receiving the new voltage signal sample from the hold module and receiving one of the reference voltage R+Δ or R−Δ for the selected pixel to compare with the voltage signal sample, the comparator configured to generate a high voltage output signal if the voltage signal sample is greater than either of the reference voltage R+Δ or R−Δ and to generate a low or null voltage output if the voltage signal sample is less than either of the reference voltage R+Δ or R−Δ. A two bit register is provided that includes a most significant bit (MSB) and a least significant bit (LSB), the two bit register providing a two-bit output signal.

A logic module receives the voltage output from the comparator and is configured and operable to: a) select the reference voltage R+Δ to be provided to the comparator and to set the MSB to a logic "0" in response to a low voltage output signal from the comparator or to a logic "1" in response to a high voltage output signal from the comparator, and then b) select the reference voltage R−Δ to be provided to the comparator and to set the LSB to a logic "0" in response to a low voltage output signal from the comparator or to a logic "1" in response to a high voltage output signal from the comparator. A background subtraction module is configured and operable to receive the two-bit output signal from the two-bit register for the selected one of the at least one sensor element and to identify, based on the two-bit output signal, whether the measurable parameter detected by the selected one of the at least one sensor element is within or outside the threshold around the reference value for the measurable parameter.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 1:
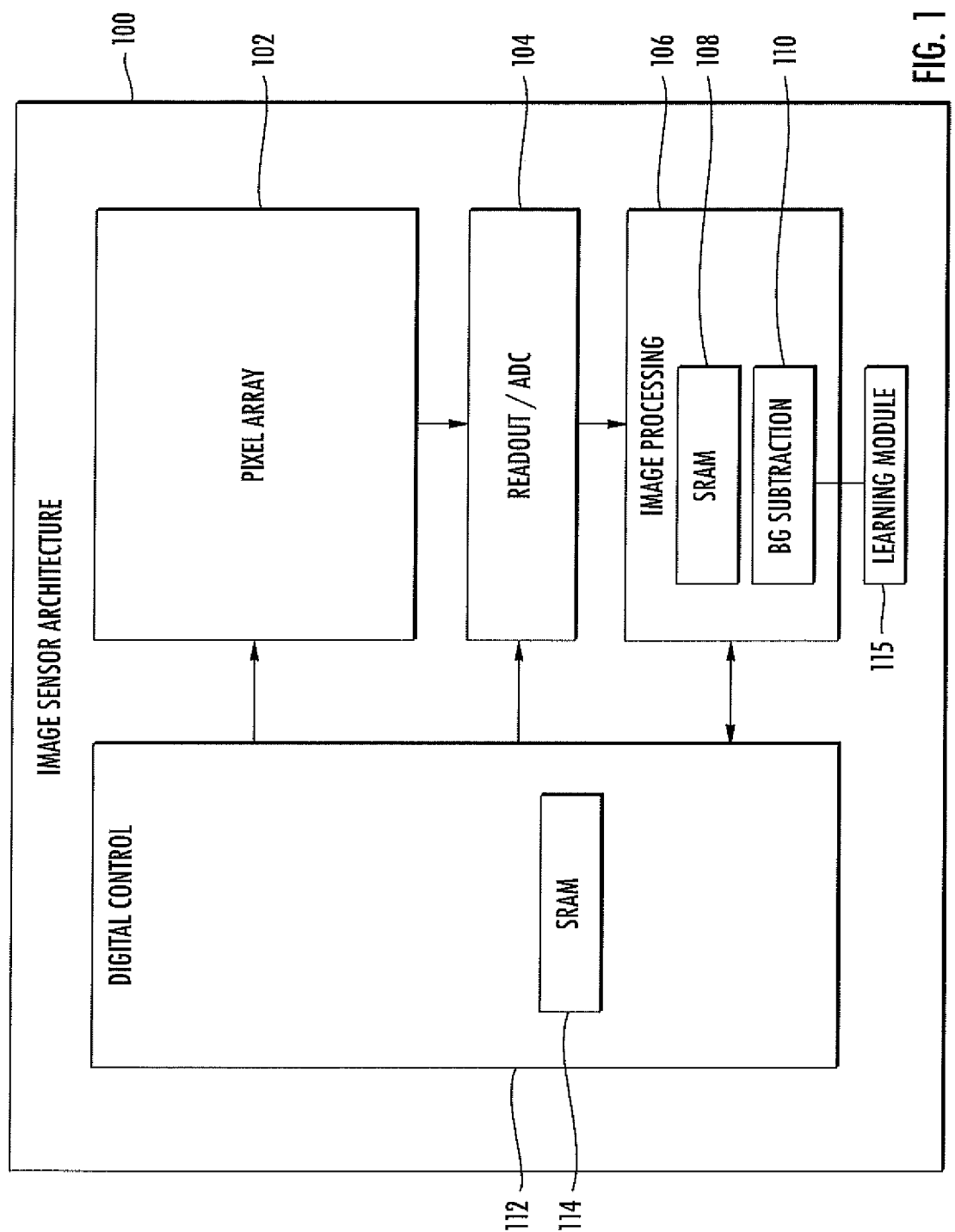
FIG. 1 is a simplified block diagram of one example of an imaging sensor system in accordance with a described embodiment of the disclosure.

FIG. 1 illustrates a simplified block diagram of one example of an imaging sensor system 100 according to a described embodiment of this disclosure. The imaging sensor system 100 comprises a pixel array 102, a readout circuit or an Analog-to-Digital Converter (ADC) 104, and an image processing unit 106. Although an imaging sensor system 100 having an ADC 104 configured to read intensity of light is illustrated, other non-imaging systems may be provided that are configured to read other forms of signals, such as temperature signals, acoustic signals, optical signals, etc. The pixel array 102 can be a large area array with a plurality of tiles or super-pixels, with each super-pixel comprising a plurality of pixels. As discussed above, it is also contemplated that the "pixel array" include an array of sensors other than optical sensors, or even one sensor in certain embodiments, such embodiments incorporating a temperature sensor. In one example related to optical imaging, the pixel array 102 can comprise 16×16 tiles or super-pixels, and each tile or super-pixel can comprise 8×8 pixels. The imaging sensor system 100 detects and records the intensity of light rays incident on each super-pixel and/or pixel of the pixel array 102, and in particular assigns a value specific to each super-pixel and/or pixel indicative of that intensity. In one conventional pixel array, the voltage response of the pixel increases as the intensity of the light received by that pixel increases.

The readout circuit or ADC 104 coupled to the pixel array 102 reads pixel values or voltages corresponding to the intensity of light rays and then converts these voltages into digital values. In the conventional image sensor architecture, the intensity values correspond to gray scale image values in which the range of light intensity is represented by 10 bits of digital data. It is understood, however, that in other applications, the intensity values can correspond to the intensity of a certain wavelength, such as red, green or blue. Once the pixel values are converted into digital data, the digital data is transmitted to the image processing unit 106 that is coupled to the readout/ADC 104. The image processing unit 106 is configured to utilize the digital data corresponding to the intensity of lights to detect motion of object(s) across the pixel array 102. The image processing unit 106 comprises a computer readable medium, such as a SRAM 108 and a background (BG) subtraction module 110. A set of instructions is stored or programmed in the background subtraction module 110 which is operable to direct the image processing unit 106 to detect motion of object(s) across the pixel array 102 based on the digital data corresponding to the intensity of light detected by pixels or super-pixels within the array. In particular, the background subtraction module subtracts pixels from consideration in which the digital data corresponding to light intensity at that pixel corresponds to the digital data for a portion of the background image detected by the particular pixel. In some embodiments, a set of instructions corresponding to a background subtraction method implemented by the module 110 is stored or programmed directly on the image processing unit 106, which instructions are operable to direct the imaging processing unit 106 to detect the appearance and motion of object(s) across the pixel array 102 relative to the background.

An optional learning module 115 coupled to the background subtraction module 110 may be configured to learn on the fly, and in particular to learn the background scene, moving object, still object, etc., on the fly or in real time. For instance, the learning module can be configured to learn that a particular moving object is a pet, such as a dog. Information corresponding to the image of the dog, as detected by the pixel array, is stored on the SRAM 108. Over time, the learned information is stored on SRAM 108 and the image processing unit 106 updates the learned information previously stored on the SRAM 108 with new learned information. For instance, if the initial learned information is a dog, a new moving object is detected and the learning module learns that the new moving object is a cat, the image processing unit 106 then updates the previously learned information with the new learned information, e.g. the cat. In other embodiments, the learned module may learn from detected information over time and store the learned information in the SRAM 108 for use in next event. This stored information provides a database of known objects against which the processing unit 106 can compare a new image to determine whether the "new" image is actually the same pet, for instance.

The imaging sensor system 100 further comprises a digital control unit 112 coupled to at least one or more of the pixel array 102, the readout/ADC 104, and the image processing unit 106. The digital control unit 102 may control and/or synchronize any suitable number of the units 102, 104, 106. In one embodiment, the digital control unit 102 chooses certain pixels and/or super-pixels of the pixel array 102 to be read out and digitized by the readout/ADC 104. In another embodiment, the digital control unit 102 can control various parameters such as frame-rate, integration time, bit-depth, and so forth. When no object is detected across a super-pixel of the pixel array 102, the digital control unit 112 maybe operable to set the super-pixel of the pixel array 102 in a low-resolution mode. By doing this, much less data is read out and digitalized by the readout/ADC 104, leading to a reduction in the power consumption of the imaging sensor system 100. However, since an object may still appear in the visual range of the particular super-pixel, the super-pixel continues to be monitored albeit at a lower resolution. Once an object(s) is detected, the digital control unit 112 then sets the super-pixel of the pixel array 102 in the high-resolution mode, so that the image of the object is fully captured.

The background subtraction unit 110 of the image processing unit 106 may be configured and operable to update background information or to update a background model in the SRAM 108 when changing lighting conditions or moving object in the background (for example, a chair) is detected by the super-pixels of the pixel array 102. The background model is the same size as a frame. However, the background model for each super-pixel is updated independently. If there is a change, the super-pixel of the pixel array 102 detects a change and digital control unit 112 switches the super-pixel of the pixel array 102 to a high-resolution mode. In some embodiments, the image processing module 106 detects that the background model needs to be updated, and the background model is updated and stored in the SRAM 110 while the super-pixel of the pixel array 102 is in the high-resolution mode.

As previously described, the image processing unit 106 is operable to execute a set of program instructions operable to control the exposure time of the imaging sensor system 100. The image processing unit 106 in one embodiment controls the exposure time when lighting condition changes to avoid having to relearn the background. A change in lighting condition can be detected when all pixels in the frame change by about the same percentage. In another embodiment, it is possible for the image processing unit 106 to detect that lighting has changed using a separate device of light sensor. The digital control unit 112 can then change the exposure time accordingly to cancel the effect of lighting change—i.e., when the ambient lighting decreases or increases, the exposure time of the pixels can be increased or decreased accordingly to achieve, in effect, a consistent lighting intensity, and therefore pixel intensity. This adjustment of exposure time will result in less frequent background updates which will lead to power savings.

The digital control unit 112 comprises a computer readable medium, e.g. SRAM 114 similar to the SRAM 108 of the image processing unit 106. Information related to the super-pixel configurations for low-resolution mode and high-resolution mode can be stored in the SRAM 114 of the digital control unit 102. The image processing unit 106 coupled to the digital control unit 112 receives a request command from the digital control unit 102 regarding which part of the frame of the pixel array is to be read in one of the high-resolution mode or the low-resolution mode. The frame of the pixel array may be a row.

Figure 2:
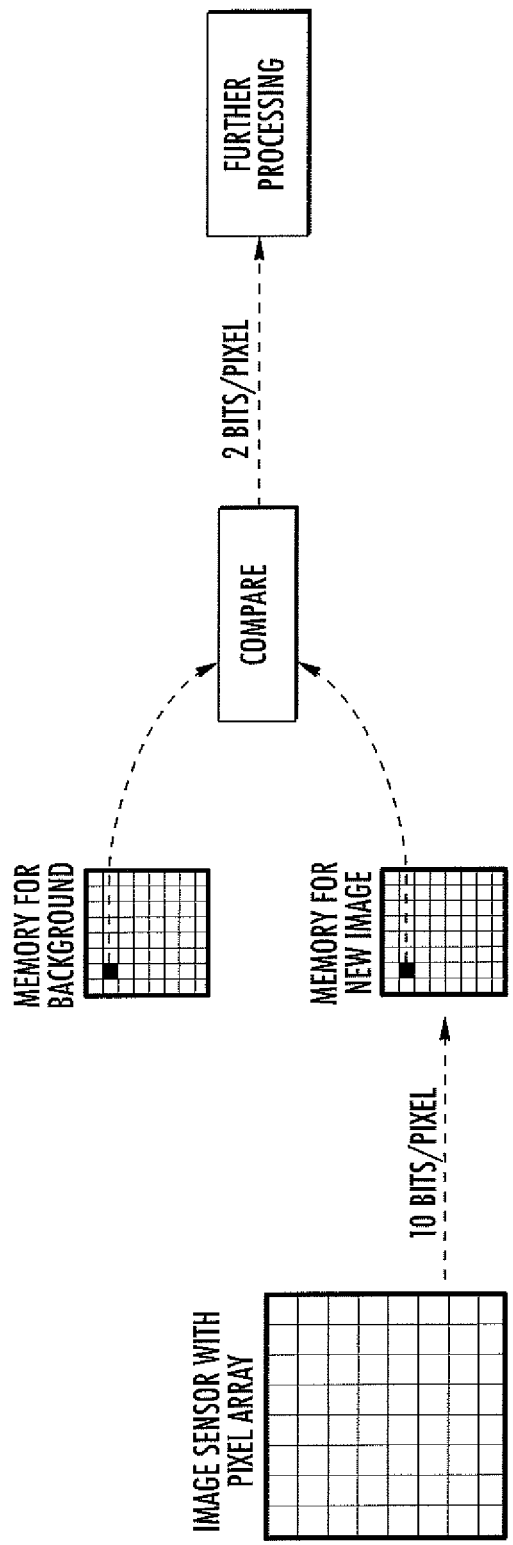
FIG. 2 is a diagram of a conventional algorithm for detecting and subtracting background images from a digitized image.

Algorithms such as computer vision (CV) algorithms, are used in a variety of applications such as surveillance, smart home, autonomous driving, etc. In many of these applications, the algorithms are adapted to differentiate between a background model (composed of, for example, trees and buildings and roads) and foreground object (for example, pedestrians and cars). FIG. 2 is a diagram of a common method for the detection of foreground objects. First, a background model is created using a computer vision algorithm, in which the background model represents what the image would look like if there are no foreground objects in the scene. The background model is thus preferably created prior to utilizing the computer vision algorithm to detect objects in a scene. This background model includes light intensity data for each pixel within the pixel array corresponding to the light intensity of the location of the background image sensed by the particular pixel. This background model is stored in memory for future processing. When a new image is captured by the image sensor, the new image data is digitized (usually 8-12 bits per pixel) for each pixel within the array, which new data is also stored in memory. Then the new image is compared with the background model, pixel by pixel, with the results of the comparison passing for further processing. In the case of a super-pixel, the pixel-by-pixel comparison is still undertaken within the super-pixel. and the number of pixels that are different from their background counterpart are determined. The result of the comparison can be a single bit, with a binary "0" corresponding to no match between the background and new data and a binary "1" corresponding to a match between the data. In the case of the super-pixel, a binary "0" corresponding to no match between the background and new data is generated based on the number of different pixels found within the super-pixel. In most cases the comparison results in a 2 bit binary number for each pixel (or super-pixel). In another embodiment, the algorithms may be used to compare a signal from another type of sensor with a reference value. The sensing element can be a temperature sensor, a motion sensor, an acoustic sensor, an imaging sensor, an optical sensor, or any suitable sensing elements.

Figure 3:
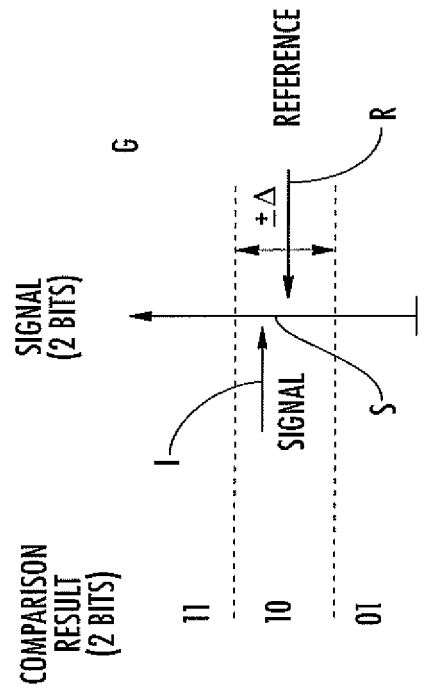
FIG. 3 is a diagram of a conventional approach for performing the pixel-by-pixel comparison of the algorithm depicted in FIG. 2.

FIG. 3 schematically illustrates how the pixel-by-pixel comparison is implemented in a conventional approach. First, the pixel intensity is digitized through the ADC. As mentioned above, this pixel voltage is digitized to an 8-10 bit value, and more typically to a 10 bit signal. This 10 bit intensity signal I is approximated by the nearest gradation S on a 10 bit intensity gradation line G. The digital value corresponding to this gradation S on gradation line G is stored in the memory as shown on FIG. 2. This process is applied to the background pixel to find the background intensity gradation R. The background intensity R is used to find the gradations corresponding to the threshold ±Δ centered on the background pixel intensity. Then each pixel value of the new image is compared with the intensity of the corresponding background pixel, and in particular to the threshold ±Δ values. If the pixel value is within a threshold ±Δ of the background intensity value R, as is the case in FIG. 3, then it is assumed that the pixel in the new image is similar to the corresponding pixel of the background image. On the other hand, if the intensity of the pixel is outside the threshold ±Δ the pixel is assumed to belong to a foreground object and not to the background. In this conventional approach, the final result of the pixel-by-pixel comparison is simply an identification of a region within which a new image pixel intensity value falls, —i.e., above the threshold, within the threshold or below the threshold. Thus, the results of this comparison can be summarized with two bits as shown on FIG. 3, namely a binary "01" for a pixel intensity below the threshold ±Δ around the background pixel, a binary "10" for a pixel intensity within that threshold, and a binary "11" for a pixel intensity above the background pixel threshold. After this pixel-wise comparison, more processing occurs to finally determine all of the pixels corresponding to the foreground object(s). Each pixel of the new image will then have a corresponding 2-bit value as a result of the comparison the comparison to the background pixels, with all pixels having a binary "10" being identified as pixels corresponding to the background and all pixels having a binary "11" or "01" corresponding to the new object(s) passing through the viewing field. This information is processed within the image processing module 106 to identify the new object(s) in the current scene and to generate an output in response to the identification of the object(s). This further processing can including providing a display of the object(s) and/or identifying the presence of the object(s) and/or identifying the nature of the object(s) within the viewing field.

The present disclosure provides a method that reduces the power requirements for comparing pixels between a new image and a stored background image in which only two comparison operations are performed instead of the fine quantization as in the conventional method. Rather than processing a 10-bit digital signal indicative of pixel intensity, the present disclosure only requires a 2-bit signal. In particular, the present method is based on recognizing that the actual intensity of the light detected by a particular pixel is not relevant to whether the intensity of the pixel in a new image is within a threshold of the intensity of the same pixel in a background image.

Figure 4:
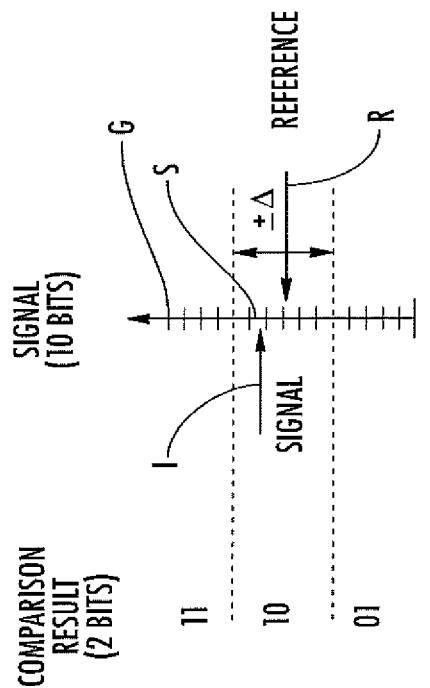
FIG. 4 is a diagram of a new approach according to the disclosure for performing the pixel-by-pixel comparison of the digitized images depicted in FIG. 2.
Figure 5:
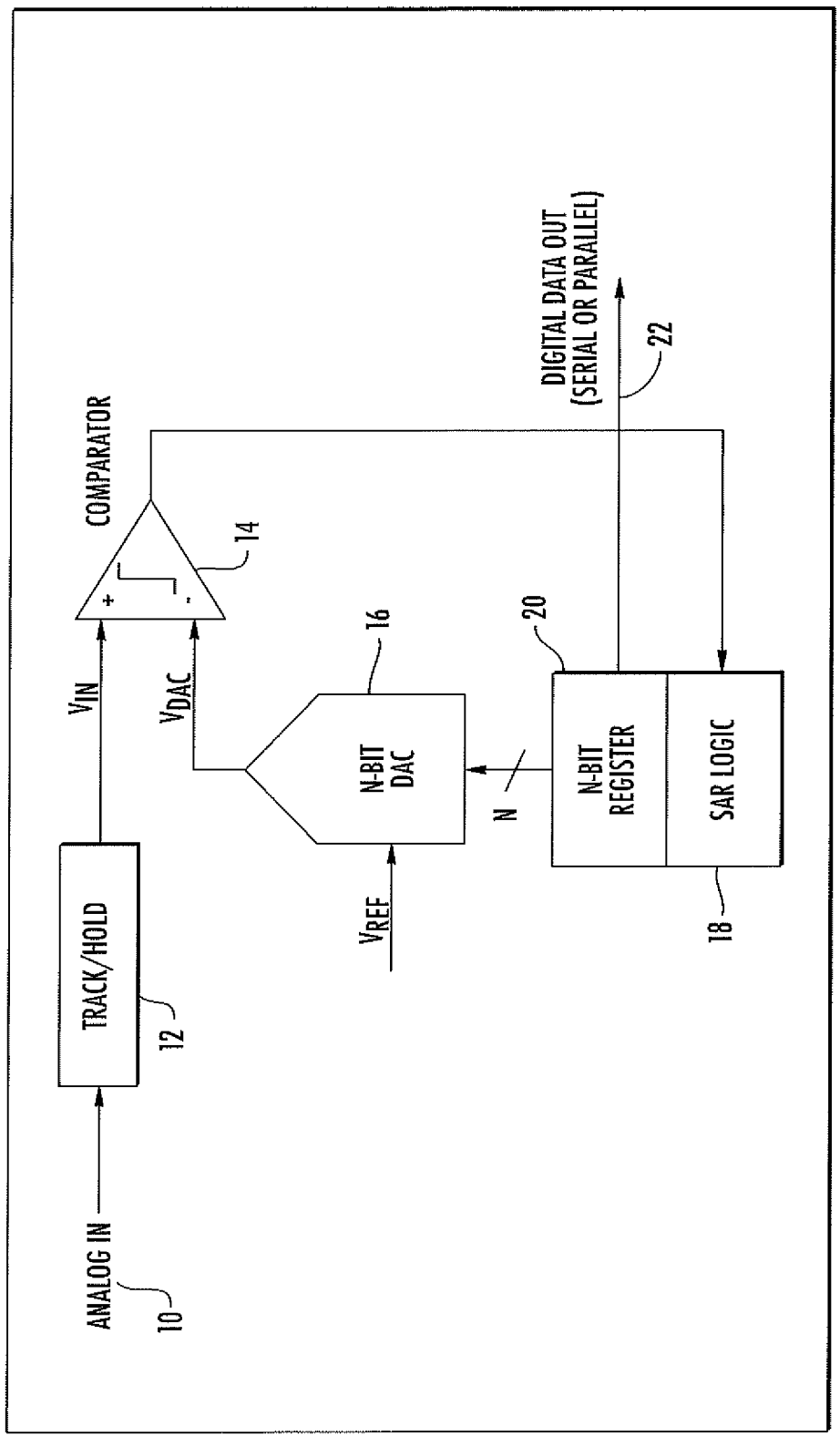
FIG. 5 is a diagram of the architecture of a logic ADC for use in the approach shown in FIG. 4.

This method is accomplished by modifications to the Analog-to-Digital convertor (ADC). The modified ADC may be integrated into devices or systems such as imaging devices, optical devices, temperature devices, sound devices, and any suitable devices. The ADC only requires information about the pixel, including the background intensity value R, and the pre-determined threshold (Δ) in order to make only two comparisons, as depicted in the diagram of FIG. 4. In one specific embodiment, the ADC can be modified by incorporating aspects of a Successive Approximation Register (SAR) ADC. The SAR ADC utilizes a capacitive digital-to-analog convertor (DAC), which simplifies having two comparisons for each pixel based on its background value and the threshold (Δ). One architecture of a modified ADC suitable for the present disclosure is shown in FIG. 5. The modified ADC can have a sample rate of 5 Msps and a resolution of 8-16 bits. In another embodiment, the ADC can have a sample rate equal to and no more than 10 Gsps.

The "analog in" signal 10 in the modified ADC architecture of FIG. 5 corresponds to the voltage of the pixel for the new image to be compared to the voltage of the same pixel for the background image. The pixel voltage is fed to a track-and-hold component 12 which samples the "analog in" signal 10 on the falling edge of a sample clock (not shown). In the track-and-hold function the module 12 continues to track the "analog in" or pixel voltage. Alternatively, the "analog in" signal can be provided to a sample-and-hold module. The hold module 12 provides an input voltage to a comparator 14. The other input to the comparator 14 is a voltage $V_{DAC}$ that corresponds to the voltage of the sampled pixel in the background image, or more specifically to one of the threshold voltages R±Δ around the background pixel voltage (FIG. 4). Thus, the input $V_{REF}$ to the N-bit DAC 16 corresponds to either the high range voltage, namely the background pixel voltage R+Δ, or to the low range voltage, namely the background pixel voltage R−Δ. The logic element 18 of the modified ADC controls the selection of the $V_{REF}$ voltage provided to the N-bit (or in the present case 2-bit) digital-to-analog converter 16 (DAC) as well as the selection of the two bits in the n-bit register 20. The N-bit register 20 in the present modified ADC is a 2-bit register with both output bits 22 set initially to a logic "1". If the $V_{IN}$ corresponding to the new pixel voltage is less than the low range voltage R−Δ of the background pixel, the comparator output is a low or null voltage output, which is interpreted by the logic element 18 as requiring a logic "0" for the particular bit. The logic element thus changes the most significant bit (MSB) to a logic "0". If the new pixel voltage is greater than the low range voltage −Δ, the comparator output would have been a high voltage which would have been interpreted by the logic element 18 as a logic "1", and the logic element would have retained the MSB at its initial value "1".

The logic element then moves to the least significant bit (LSB). The same input voltage "analog in" 10 sampled at the sample-and-hold 12 is compared with the high range voltage and if the $V_{IN}$ corresponding to the new pixel voltage is less than the high range voltage of the background pixel, then the comparator generates a low or null voltage output and the logic element clears the least significant bit (LSB) to a logic "0", otherwise the LSB remains at a logic "1". If the value of the pixel in a new image is not read out, then the $V_{IN}$ will be zero and will always be less than the reference voltage and its high and low range voltages R±Δ, in which case the two bits in the register will both be cleared to logic "0"s.

It is contemplated that the SAR logic 18 or the digital control 112 (FIG. 1) will sequentially sample all of the pixels in the pixel array and provide the pixel-related voltage to the modified ADC for processing as described above. The output 22 of the modified ADC of the present disclosure for each pixel of the pixel array will be:

'00': if the new pixel value has not been read out
'01': if the new pixel value is below the background value range R−Δ
'10': if the new pixel value is within the threshold R±Δ of the background value
'11': if the new pixel value is above the background value range R+Δ.

This information can then be provided for subsequent processing of the image data, as discussed above. It is understood that the voltage signals from all of the pixels in the pixel array 102, or any desired subset of those pixels, passes through the modified ADC of the present disclosure so that each pixel will have a corresponding two-bit output 22. As discussed above, the image processor 106 receiving this output can be used to identify new object(s) in the current scene and to generate an output in response to the identification of the object(s), which output can be a display of the object(s) and/or an identification of the presence of the object(s) and/or an identification of the nature of the object(s) within the viewing field. It is contemplated that pixels having a register value of "01" or "11" will be displayed in a new image because the light detected by that pixel is different from the light detected in the background image.

It can be understood that the modified ADC disclosed herein can be used for comparing a new sensor value to previous or background sensor data. The "analog in" signal 10 in FIG. 5 would correspond to the new or current output of the sensor and the $V_{REF}$ would correspond to a prior or background sensor value, or more particularly to a threshold ±Δ around that background sensor value (i.e., R±Δ).

Figure 6:
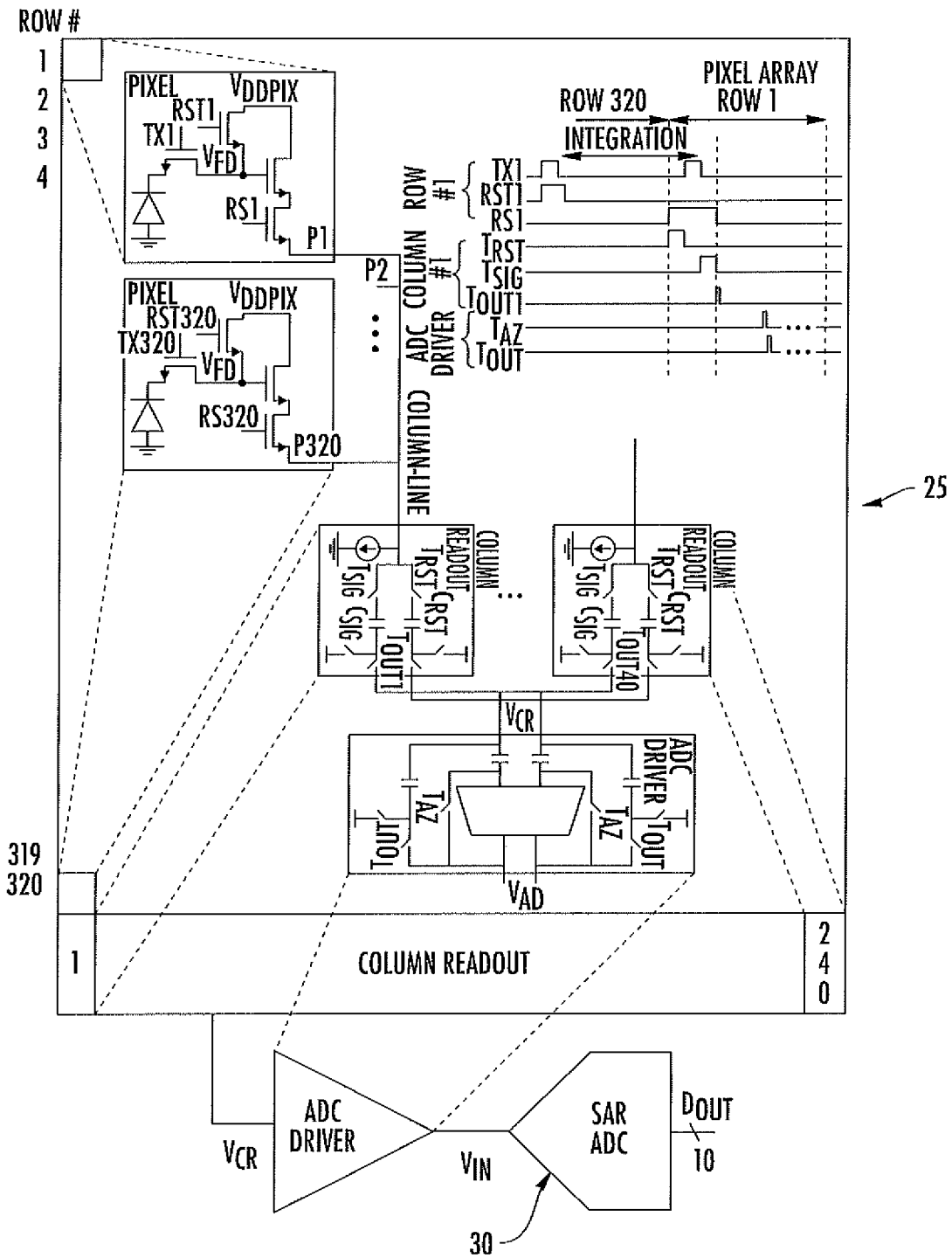
FIG. 6 is a block diagram of a pixel array incorporating the logic ADC of FIG. 5 according to one embodiment of the present disclosure.

The logic ADC is incorporated into an exemplary pixel array, as shown in FIG. 6. In particular, the pixel array 25 can be a QVGA-size array of 320×240 pixels. The array can be divided into 20×15 super pixels, each consisting of 16×16 pixels. It is contemplated that the controller, such as controller 112 (FIG. 1) can operate each super-pixel independently in a low resolution, in which only selected pixels of the super-pixel are read at less than the maximum frame rate, or in a high resolution mode, in which all pixels are read at a maximum frame rate. In one embodiment, the controller operates the super-pixels in the high-resolution mode to "learn" the scene being detected and imaged. After this initial step, the controller operates the super-pixels in the low-resolution mode unless and until the controller detects a change in a super-pixel, at which time the particular super-pixel(s) is operated in the high-resolution mode. The pixel array can be provided with a register corresponding to each super-pixel that stores the operating mode status of the super-pixels.

As depicted in FIG. 6, the pixel array includes standard 4T pixels with a pitch of 4 μm and operated by three signals: reset (RST), row-select (RS), and charge-transfer (TX). Every row is reset (regardless of the state of the super-pixels) to avoid blooming. Correlated double sampling (CDS) is employed at the readout circuit to cancel the charge noise on the floating diffusion node and also the flicker noise of the source follower transistor in the pixel. First the reset voltages of the floating diffusion (VFD) nodes in one row are copied to CRST capacitors (during TRST) before the charge transfer, and then the light intensity signals are copied to CSIG capacitors (during TSIG) after the charge transfer. When an super-pixel is in the low-resolution mode, the column readout samples the reset and signal values (on CRST and CSIG) only for the active pixels. This ensures that the data rate is reduced at the pixel array. Because of the low pixel count of the array as well as the low frame-rate (10 fps), a single analog-to-digital convertor (ADC) with a conversion time of 1.2 μs can be used to digitize all pixel values. The ADC driver can be a switched capacitor amplifier with an auto-zeroing phase (TAZ).

The output of the ADC driver is the analog voltage provided to the modified SAR ADC 30 constructed as shown in FIG. 5. Thus, the output of the ADC driver can be converted to an analog voltage supplied to the comparator 14 (FIG. 5) for comparison to the background voltage R±Δ. The SAR logic 18 (FIG. 5) chooses the voltage comparison points based on the pixel being read by the ADC in the pixel array 25. The modified SAR ADC 30 of the present disclosure simplifies the comparison process because a full binary search is no longer required, as in prior devices, and instead the comparison points can vary between pixels depending on the background. It is contemplated that the same SAR ADC 30 can be operable to perform the binary search in one mode of operation in which the pixel values are digitized to ten bits. However, in the second mode of operation, which can be called a difference-sampling mode, the SAR ADC only compares the pixel value with two references so that only two bits are necessary to determine If the current pixel value is close to, brighter than or darker than the background value for that pixel (or whether the pixel was inactive).

Embodiments within the scope of the disclosure may also include non-transitory computer-readable storage media or machine-readable medium for carrying or having computer-executable instructions or data structures stored thereon. Such non-transitory computer-readable storage media or machine-readable medium may be any available media that can be accessed by a general purpose or special purpose computer. By way of example, and not limitation, such non-transitory computer-readable storage media or machine-readable medium can comprise RAM, ROM, EEPROM, CD-ROM or other optical disk storage, magnetic disk storage or other magnetic storage devices, or any other medium which can be used to carry or store desired program code means in the form of computer-executable instructions or data structures. Combinations of the above should also be included within the scope of the non-transitory computer-readable storage media or machine-readable medium.

Embodiments may also be practiced in distributed computing environments where tasks are performed by local and remote processing devices that are linked (either by hardwired links, wireless links, or by a combination thereof) through a communications network.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

While the invention has been described with reference to various embodiments, it will be understood that these embodiments are illustrative and that the scope of the disclosure is not limited to them. Many variations, modifications, additions, and improvements are possible. More generally, embodiments in accordance with the invention have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An image sensor comprising:
a pixel array including a plurality of pixels configured and operable to detect light from a scene, the scene including an object to be detected and a background image, each pixel of said plurality of pixels configured to generate a new voltage signal in response to the intensity of light received by said pixel;
a memory for storing digital values corresponding to a pre-determined voltage bandwidth around a prior voltage signal R of at least some of said plurality of pixels corresponding to light detected from the background image, the voltage bandwidth defining a positive delta voltage +Δ and a negative delta voltage −Δ relative to the background voltage signal R;
a sample-and-hold or track-and-hold module operable to sample the new voltage signal corresponding to a selected one of said plurality of pixels;
a digital-to-analog converter generating a reference voltage R+Δ or R−Δ from the digital values stored in said memory;
a comparator receiving the new voltage signal sample from said hold module and receiving one of said reference voltage R+Δ or R−Δ for said selected pixel to compare with said voltage signal sample, said comparator configured to generate a high voltage output signal if the voltage signal sample is greater than either of said reference voltage R+Δ or R−Δ and to generate a low or null voltage output if the voltage signal sample is less than either of said reference voltage R+Δ or R−Δ;

a two bit register including a most significant bit (MSB) and a least significant bit (LSB), said two bit register providing a two-bit output signal; and
a logic module receiving the voltage output from said comparator, said logic module configured and operable to;
select said reference voltage R+Δ to be provided to said comparator and to set the MSB to a logic "0" in response to a low voltage output signal from said comparator or to a logic "1" in response to a high voltage output signal from said comparator; and then
select said reference voltage R−Δ to be provided to said comparator and to set the LSB to a logic "0" in response to a low voltage output signal from said comparator or to a logic "1" in response to a high voltage output signal from said comparator;
a background subtraction module configured and operable to receive the two-bit output signal from said two-bit register for said selected pixel and to identify, based on said two-bit output signal, said selected pixel as detecting light from a scene that is different from the light detected by the same pixel in the background image; and
a processing module for generating an output image including said selected pixel identified by said background subtraction module.

2. The image sensor according to claim 1, further comprising a controller operable to select pixels in said pixel array to provide said new voltage signal to said hold module.

3. The image sensor of claim 1, wherein the background subtraction module only identifies the selected pixel if the value of the two-bit register is a binary "01" or a binary "11".

4. A method for determining displaying an image of a scene including an object to be detected and a background image, comprising the steps of:
scanning the scene with a pixel array including a plurality of pixels configured and operable to detect light from the scene, each pixel of said plurality of pixels configured to generate a new voltage signal in response to the intensity of light received by said pixel;
a memory for storing digital values corresponding to a pre-determined voltage bandwidth around a prior voltage signal R of selected ones of said plurality of pixels corresponding to light detected from the background image, the voltage bandwidth defining a positive delta voltage +Δ and a negative delta voltage −Δ relative to the background voltage signal R;
for each of the selected pixels;
sampling the new voltage signal corresponding to the selected pixel;
generating a reference voltage R+Δ or R−Δ from the digital values stored in said memory for the selected pixel;
comparing the new voltage signal sample to one of said reference voltage R+Δ or R−Δ for the selected pixel and generating a high voltage output signal if the voltage signal sample is greater than either of said reference voltage R+Δ or R−Δ, and generating a low or null voltage output if the voltage signal sample is less than either of said reference voltage R+Δ or R−Δ;
selecting said reference voltage R+Δ to be provided to said comparator and to set a most-significant bit (MSB) of a two-bit register to a logic "0" in response to a low voltage output signal from said comparator or to a logic "1" in response to a high voltage output signal from said comparator; and then selecting said reference voltage R−Δ to be provided to said comparator and to set the least-significant bit (LSB) of the two-bit register to a logic "0" in response to a low voltage output signal from said comparator or to a logic "1" in response to a high voltage output signal from said comparator;

identifying said selected pixel as detecting light from a scene that is different from the light detected by the same pixel in the background image based on the value of the two-bit register; and a processing module for generating an output image including said selected pixel only if it is identified in the prior step.

5. The method of claim 4, wherein the identifying step only identifies the selected pixel if the value of the two-bit register is a binary "01" or a binary "11".

6. A sensor operable to sense a measurable parameter, comprising:

at least one sensor element configured and operable to sense the measurable parameter and to generate a new voltage signal in response to the intensity of measurable parameter detected by said sensor element;

a memory for storing digital values corresponding to a pre-determined voltage bandwidth around a reference voltage signal R, the reference voltage signal R corresponding to a reference value for the measurable parameter at a selected one of said at least one sensor element, the voltage bandwidth defining a positive delta voltage +Δ and a negative delta voltage −Δ relative to the reference voltage signal R corresponding to a threshold around the reference value for the measurable parameter;

a sample-and-hold or track-and-hold module operable to sample the new voltage signal corresponding to the selected one of said at least one sensor element;

a digital-to-analog converter generating a reference voltage R+Δ or R−Δ from the digital values stored in said memory;

a comparator receiving the new voltage signal sample from said hold module and receiving one of said reference voltage R+Δ or R−Δ for said selected pixel to compare with said voltage signal sample, said comparator configured to generate a high voltage output signal if the voltage signal sample is greater than either of said reference voltage R+Δ or R−Δ and to generate a low or null voltage output if the voltage signal sample is less than either of said reference voltage R+Δ or R−Δ;

a two bit register including a most significant bit (MSB) and a least significant bit (LSB), said two bit register providing a two-bit output signal; and a logic module receiving the voltage output from said comparator, said logic module configured and operable to;

select said reference voltage R+Δ to be provided to said comparator and to set the MSB to a logic "0" in response to a low voltage output signal from said comparator or to a logic "1" in response to a high voltage output signal from said comparator; and then select said reference voltage R−Δ to be provided to said comparator and to set the LSB to a logic "0" in response to a low voltage output signal from said comparator or to a logic "1" in response to a high voltage output signal from said comparator; and a background subtraction module configured and operable to receive the two-bit output signal from said two-bit register for the selected one of said at least one sensor element and to identify, based on said two-bit output signal, whether the measurable parameter detected by the selected one of said at least one sensor element is within or outside the threshold around the reference value for the measurable parameter.

7. The sensor of claim 6, wherein the measurable parameter is temperature, said at least one sensor element is a temperature sensor, said reference value is a temperature at a previous time and said threshold is a temperature range around the predetermined temperature.

8. The sensor of claim 7, wherein said background subtraction module is configured to identifying said selected one of the at least one sensor element only when it detected a temperature that is different from the temperature at a previous time based on the value of the two-bit register; and a processing module for generating an output including said selected one of the at least one sensor element only if it is identified by the background subtraction module.

* * * * *